July 6, 1965 C. L. WHITE 3,193,419

OUTDIFFUSION METHOD

Filed Dec. 30, 1960

INVENTOR

Charles L. White

BY

Stevens, Davis, Miller & Mosher

ATTORNEYS

United States Patent Office 3,193,419

Patented July 6, 1965

3,193,419

OUTDIFFUSION METHOD

Charles L. White, Richardson, Tex., assignor to Texas Instruments Incorporated, Dallas, Tex., a corporation of Delaware Filed Dec. 30, 1960, Ser. No. 79,690

9 Claims. (Cl. 148—191)

The present invention relates to an improved outdiffusion method and more specifically relates to an improved method for reducing the surface concentration of impurities that are diffused into a semiconductor which, hereinafter, will be referred to as impurity surface concentration.

In the transistor industry the rectifying junctions of many transistors are made by indiffusion processes. The most popular and successful indiffusion method presently used comprises heating a semiconductive material in the presence of the vapor of an impurity material, the semiconductive material retaining its solid-state characteristic as the impurity diffuses therein from the vapor state. When an impurity has been diffused into a semiconductor the impurity concentration per unit of volume of the semiconductor is the greatest on the surface of the semiconductor and decreases as a function of the distance therein.

Although the aforementioned indiffusion method has been highly developed and can be advantageously controlled, the resulting impurity surface concentration is ofttimes too high, thereby giving rise to transistors whose characteristics are less than desirable. Experience dictates that lowering the impurity surface concentration improves the operating characteristics of a transistor. For instance, by lowering the impurity surface concentration of the base region of a diffused base-alloyed emitter transistor, the emitter to base breakdown voltage can be increased.

Prior methods to reduce the impurity surface concentration of transistors whose rectifying junctions have been made by indiffusion methods have been only partially successful. One prior method is to partially outdiffuse the impurities previously diffused therein and consists of placing an impurity diffused semiconductor in a chamber with a gettering agent, the gettering agent being a material on which the outdiffused impurities can easily condense. The chamber is then evacuated and sealed, and the semiconductor and gettering agent heated to an elevated temperature. Some of the impurities previously diffused into the semiconductor outdiffuse therefrom and condense on the gettering agent and the walls of the chamber. The impurity surface concentration of the semiconductor is reduced during the outdiffusion of the impurities. However, some of the impurities are diffused further into the semiconductor during this outdiffusion process.

The foregoing outdiffusion method does not provide a method for producing transistors with desirable operating characteristics in most cases. For example, where a conductivity determining type impurity has been diffused into one side of a semiconductor slice of opposite conductivity type to a controlled depth therein, a rectifying junction is formed in the semiconductor slice. The exact location of the rectifying junction is determined by the depth into the semiconductor whereby the impurity concentration is not quite sufficient to convert the conductivity type of the semiconductor material. When the semiconductor slice with a rectifying junction therein is carried through the foregoing outdiffusion process, the depth of the rectifying junction from the surface of the semiconductor slice is increased due to the further indiffusion of the impurities. If the semiconductor slice represents the collector region of a transistor and the impurity diffused region therein represents the base region of the transistor, it is seen that the foregoing method of lowering the base impurity surface concentration also increases the base width of the transistor. An increase in base region width of a transistor means a decrease in the high frequency current gain.

Another method for reducing the impurity surface concentration is to flow pure hydrogen gas over the semiconductor slice when it is heated to an elevated temperature, Outdiffusion of some of the impurities is effected, and these impurities are removed by the flow of hydrogen gas. However, the hydrogen gas must be extremely pure to prevent contamination or oxidation of the semiconductive slice surface.

The foregoing outdiffusion methods are effective in lowering impurity surface concentrations of impurity diffused semiconductors. During these processes, however, the high frequency characteristics of the transistor are degraded. Further, lengthy times are required to effect the impurity surface concentration reduction by an appreciable amount.

During the outdiffusion of impurities from a diffused semiconductor, some of the impurities are further diffused into the semiconductor. Therefore, during outdiffusion the impurity depth in the semiconductor is always increased although the total number of impurities in the semiconductor is reduced. The present invention provides a method for reducing the impurity surface concentration in a semiconductor to a value less than the value obtained by prior methods, while, at the same time, increasing the depth of the diffused impurities only to the same extent as do prior methods. Alternatively, the present invention provides a method for reducing the impurity surface concentration of a semiconductor to the same value as that obtainable by prior methods but without increasing the depth of the diffused impurities to the same extent as do prior methods. In either case the reduction of the total number of impurities is greater by the present method than by prior methods. Essentially, the present invention provides a method for making transistors of higher emitter to base breakdown voltages than heretofore attainable in the prior art. Further, transistors made using the method of the present invention have the additional advantage of desirable high frequency operating characteristics.

Accordingly, an object of this invention is to provide an improved method for rapidly reducing the impurity surface concentration of a semiconductor.

Another object of this invention is to provide an improved method for outdiffusion of impurities from a semiconductor that has impurities diffused therein.

A further object of this invention is to provide an improved method for reducing the impurity surface concentration of previously diffused germanium.

A still further object of this invention is to provide an improved method for reducing the antimony surface concentration of p-type germanium that has antimony, as the impurity, diffused therein.

An even further object of this invention is to provide an improved method for reducing the impurity surface concentration of the base region of a diffused base transistor without degrading the electrical characteristics of the transistor.

Still another object of the present invention is to provide an improved method for rapidly reducing the impurity surface concentration of the base region of a diffused base transistor without unduly increasing the base width thereof.

Other and further objects, features and advantages will become apparent by way of example, from the following detailed description of specific embodiments of the invention when taken in connection with the drawings wherein.

Figure 1:
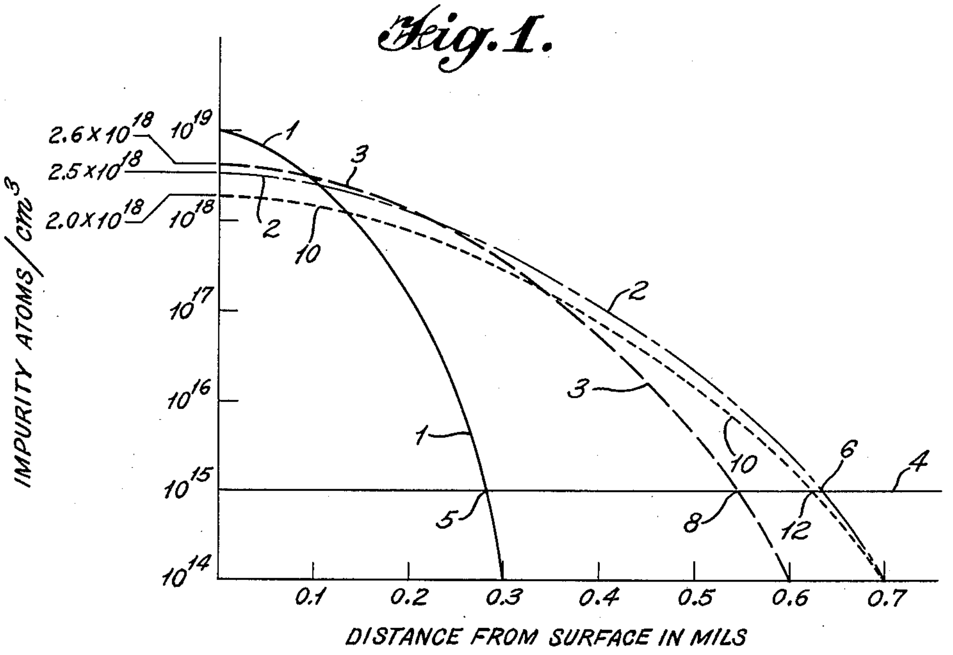
FIGURE 1 shows graphs illustrating various diffused impurity profiles of impurity concentrations per unit of volume as a function of depth in a semiconductor.

Referring now to FIGURE 1 a graph of the profile of a typical impurity diffusion into a semiconductor is shown, the curve represented by the numeral 1 being for the concentration of impurity atoms in the semiconductor in atoms/cm.$^3$ as the ordinate versus the distance into the semiconductor from the surface thereof in mils as the abscissa. The curve represented by numeral 1 is a typical profile resulting from well-known indiffusion methods, the curve analytically being expressed, for example, as a modified error function curve, an exponential function or a Gaussian function. Other functions are possible according to the method by which the indiffusion was carried out.

For purposes of illustrating the present invention a typical transistor structure will be described, that structure being a diffused base-alloyed emitter germanium transistor of the p-n-p variety. Initially, an n-type conductivity determining impurity is diffused into one side of a p-type conductivity germanium slice, forming a base region therein. For example, pure antimony in the vapor state is diffused into a p-type germanium slice of electrical resistivity of approximately 1.5 to 1.8 ohm-cm. The average concentration of p-type impurities per unit volume in the germanium slice is seen from FIGURE 1 to be about $10^{15}$ carriers/cm.$^3$, the profile being represented by numeral 4. The temperature of diffusion is about 700° C., the diffusion being carried out over a time interval of about 8 minutes, thus forming a n-type base region in the p-type germanium slice. The width of the base region (the width being the depth of n-type region in the p-type geraminum slice) is about .03 mil. The resulting antimony surface concentration is about $10^{19}$ atoms/cm.$^3$. The impurity concentration profile of the base is represented by numeral 1. The p-n junction between collector and base is represented by numeral 5.

As aforementioned, the base impurity surface concentration, if too high, must be reduced. By methods of the prior art, lowering of the impurity surface concentration by outdiffused resulted in an unduly increased base width, the base width increase thereby reducing the high frequency gain of the transistor. If the base region impurity surface concentration, the profile being represented by numeral 1, is reduced by methods of the prior art, a curve similar to that designated by numeral 2 will be obtained. A typical base region profile as represented by numeral 2 is a profile of the base impurity concentration after surface concentration reduction and base impurity redistribution. The new base-collector junction is represented by numeral 6. The base width has been increased by the distance between numerals 5 and 6, or an increase of .04 mil.

According to the method provided by the present invention a curve of the base impurity concentration per unit volume as a function of distance can be obtained essentially the same as that represented by numeral 3 in FIGURE 1. Curve 3 indicates approximately the same base impurity surface concentration and a lesser base width than that of curve 2 in FIGURE 1. The junction of curve 3 is represented by numeral 8. Alternatively, a profile similar to that designated by numeral 10 can be obtained by the method of the present invention, the junction being represented by numeral 12. In this instance it is seen from FIGURE 1 that the base width has been increased approximately by the same amount as that of prior methods, or curve 2. However, the impurity surface concentration of curve 10 is lower than that of curve 2.

A comparison of the curves of FIGURE 1 is as follows. Prior methods tend to increase the impurity depth from about .03 mil to about .07 mil for a surface concentration reduction from about $10^{19}$ atoms/cm.$^3$ to about $2.5\times10^{18}$ atoms/cm.$^3$. The new method reduces the surface concentration to about $2.0\times10^{18}$ atoms/cm.$^3$ for the same depth increase. Alternatively, for about the same reduction in surface concentration as the prior methods, the new method increases the depth from about .03 mil to only about .06 mil. Although the differences in surface concentrations and base widths between the curves obtained by the present method and those obtained by prior methods appear small, these small differences nevertheless produce marked changes in the operating characteristics of transistors as will be seen in the foregoing detailed descriptions.

Figure 2:
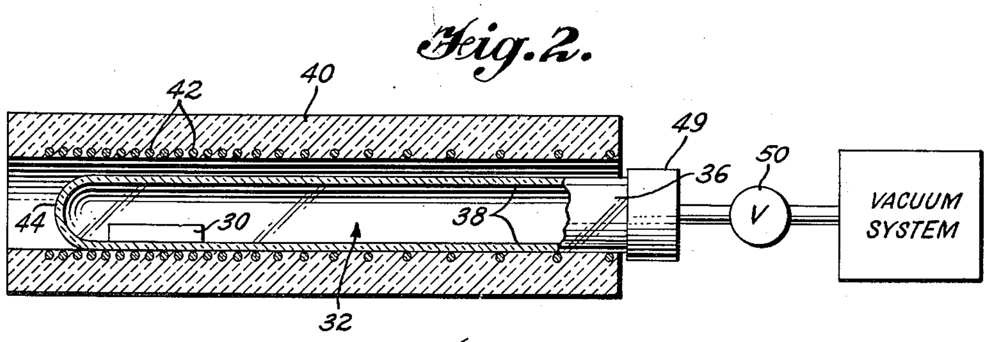
FIGURE 2 is a sectional view of one apparatus for carrying out the method of the present invention.

Referring now to FIGURE 2 a sectional view is shown of an apparatus useful in practicing the present invention. Initially, a p-type germanium slice 30 that has had antimony diffused into one side thereof to form an n-type base region therein is placed in a quartz tube 32. The impurity concentration profiles of the p-type collector region and n-type base region are as shown by numerals 4 and 1 respectively in FIGURE 1. A vacuum system is connected to the one open end of the quartz tube 32 via vacuum valve 50. A vacuum tubing 49 is used to interconnect quartz tube 32 and the vacuum system. The other end 44 of the quartz tube 32 is closed. Vacuum valve 50 is opened to the quartz tube 32, and the tube 32 is evacuated. Although it has been found that the method of the present invention is operable with the reduction to any pressure within the quartz tube, a reduction of pressure within the tube below $10^{-3}$ mm. of mercury is preferred. After evacuation the vacuum valve 50 is closed, thereby shutting the vacuum system off to the quartz tube 32 but maintaining the quartz tube 32 air-tight. The quartz tube 32 is then placed in a tubular furnace 40 and heated by electric heating coils 42. The temperature of the germanium slice 30 is raised to a value sufficient to cause outdiffusion of the antimony impurities therein, the required temperature being from about 625° C. to about 800° C. for this particular purpose. It has been experimentally determined that heating of the germanium slice 30 to about 700° C. gives good results. It has also been determined that heating of the wall portion generally designated 38 of the quartz tube 32 to a lesser temperature than that which germanium slice 30 is heated, gives better results than heating the entire length of the quartz tube 32 to the same temperature. This is simply because once the outdiffused antimony condenses on the cooler walls 38 of the quartz tube 32, there will be very little tendency for the condensed antimony to return to and condense on germanium slice 30. An approximately linear temperature gradient is maintained throughout the tube length, the germanium slice 30 being at 700° C. and the quartz tube walls 38 being at 400° C. at a horizontal distance of 12 inches from germanium slice 30. It has been found that a temperature difference between germanium slice 30 and quartz tube walls 38 at a distance of about 12 inches therefrom of from about 250 centigrade degrees to about 350 centigrade degrees will produce desirable results. A gradient furnace with heating coils 42 is used to accomplish the required temperature difference between germanium slice 30 and wall 38 of quartz tube 32.

The temperature of the germanium slice 30 is held at about 700° C. for a time from about 10 to 15 minutes, during which time the vacuum system remains closed off from quartz tube 32 by vacuum valve 50. During this time the outdiffused antimony fills quartz tube 32 in the vapor state, some of the antimony condensing on the inside walls of quartz tube 32. After the prescribed outdiffusion time, the vacuum system, via vacuum valve 50, is opened to the quartz tube 32, the vacuum system removing antimony impurities from quartz tube 32 through opening 36. Again opening the vacuum system to quartz tube 32 removes the outdiffused antimony from the presence of the germanium slice 30 and prevents most of the outdiffused antimony in the near presence of germanium slice 30 from condensing on the germanium surface. It has experimentally been found that the vacuum system, after being opened to the quartz tube for a period of about 30 seconds, removes substantially as many outdiffused antimony impurities as possible.

A longer time than the specified 10 to 15 minutes is required if the germanium slice 30 is heated to a temperature less than 700° C. During the process of reopening the vacuum system to quartz tube 32 to remove the outdiffused impurities, the time period that the vacuum system is opened to the quartz tube 32 should be governed by the time required to reduce the pressure by approximately the same amount it was increased by the outdiffused impurity atoms.

After the removal of the outdiffused impurities the vacuum system is again closed off from quartz tube 32, maintaining quartz tube 32 air-tight thereafter. The temperature of the germanium slice 30 is then lowered to room temperature either by removal of quartz tube 32 from furnace 40 or stopping the current flow in heating coils 32. The rate of decrease of the temperature of germanium slice 30 is not critical, although the rate should be slow enough to prevent thermal shock. The germanium slice 30 is removed from quartz tube 32 after cooling, the outdiffusion and reduction of impurity surface concentration being completed. The emitter of the transistor is then alloyed to the base region to complete the fabrication of the device.

The outdiffusion method just described is effective in producing devices superior to those made by methods of the prior art. However, even better results have been obtained by using a variation of this method that is described in the following paragraphs. For example, it has been experimentally determined that a gettering agent placed in the presence of the germanium slice 30 during the time the outdiffusion takes place provides an excellent substrate for the outdiffused impurities to condense on. As used in the present invention the gettering agent is a material such as ultra-pure germanium.

Figure 3:
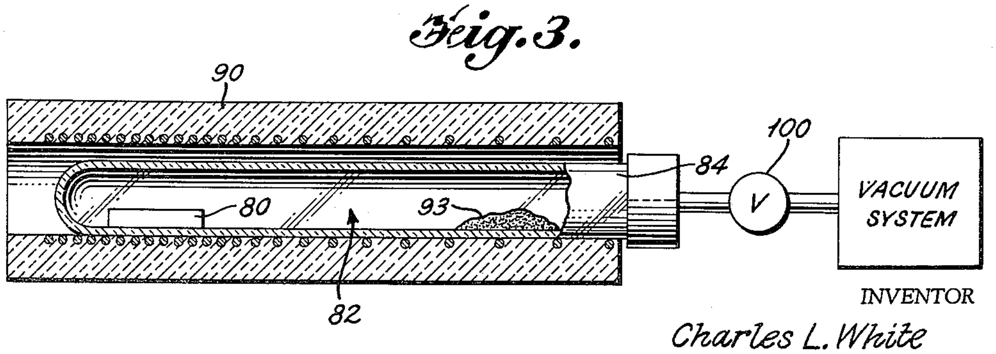
FIGURE 3 is a sectional view of the same apparatus shown in FIGURE 2 illustrating practice of a modified method according to the present invention.

As shown in FIGURE 3, a gettering agent 93 is positioned in a quartz tube 82 between the diffused germanium slice 80 and the tube opening 84. The same step-by-step procedure for outdiffusion as described in connection with FIGURE 2 is carried out with the addition of gettering agent 93. After the quartz tube 82 has been evacuated, it is positioned in a temperature gradient furnace 90 as shown. The temperature of the germanium slice 80 is raised to about 700° C., and the temperature of the ultra-pure germanium 93 is raised to from about 450° C. to about 550° C. The range of temperatures as specified for germanium slice 30 and quartz tube walls 38 in connection with FIGURE 2 are equally applicable for diffused germanium slice 80 and the ultra-pure germanium gettering agent 93 as seen in FIGURE 3. That is, germanium slice 80 can be heated to a temperature of about 625° C. to about 800° C., the temperature of ultra-pure germanium 93 being from about 250 centigrade degrees to about 350 centigrade degrees less than that of germanium slice 80. The difference in temperatures of the germanium slice 80 and ultra-pure germanium 93 is achieved in the gradient temperature furnace 90. The gettering agent, or ultra-pure germanium 93, is a very effective condensing surface for the outdiffused impurities because of its undoped characteristic. Impurities, either p or n-type, will readily condense thereon. Although the ultra-pure germanium 93 acts as a gettering agent when its temperature is the same as that of the germanium slice 80, a relatively low temperature of the intrinsic germanium 93 with respect to the germanium slice 80 further increases the condensing efficiency of the outdiffused impurities thereon. As previously described in connection with FIGURE 2 the vacuum system valve 100 is opened to quartz tube 82 for about 30 seconds for further evacuation. This propels the outdiffused impurities toward the tube opening 84 whereby many of the impurities leave the quartz tube 82 altogether, others being condensed on the ultra-pure germanium 93. Subsequently closing the vacuum valve 100 to quartz tube 82 and maintaining the tube air-tight as the respective temperatures of the germanium slice 80 and ultra-pure germanium 93 are reduced completes the outdiffusion process.

Experimental data show that keeping the vacuum valve 100 opened at all times and maintaining a substantially constant vacuum within the quartz tube 82 does not give as desirable results as the method previously described. Better results are achieved by shutting the vacuum valve 100 to the quartz tube 82 before heating the germanium slice 80, subsequently opening vacuum valve 100 to quartz tube 82 for a short period of time for further evacuation, and thereafter closing the vacuum valve 100. Theorizing, it appears that some of the antimony impurities within the germanium slice 80 will outdiffuse and "hover" over the germanium slice 80 in close proximity, these impurities being held close to the slice of coulomb forces or otherwise. By maintaining a constant vacuum during outdiffusion and during lowering of the temperatures permits the cloud of impurities to settle on the surface of the germanium slice 80, thereby resulting in a higher impurity surface concentration than desirable. Many times this settling process damages the surface and even results in a higher impurity surface concentration than the original surface concentration before outdiffusion. Opening and shutting the vacuum valve 100 to quartz tube 82 for a short period appears to jar loose the impurity cloud over the germanium slice 80, thereby forcing these impurities toward the tube opening 84.

The method as described in connection with FIGURE 3 is the preferred embodiment of the present invention. Typical characteristics of a diffused base-alloyed emitter germanium transistor, the base impurity surface concentration being reduced by the preferred method are as follows. An emitter-to-base breakdown voltage of 1.0 volt at 100 microamperes is readily attainable, the backward current at 0.9 volt being only about 10 microamperes. The aforementioned characteristics for a germanium transistor are excellent, and will be recognized as so by one familiar with transistor devices. For reverse emitter-to-base breakdown characteristics as indicated the A.C. current gain of the transistor is about 6 db at 100 megacycles. Since a lesser breakdown voltage, say 0.5 volt, can be tolerated for certain devices, the base impurity surface concentration need not be reduced to the extent that it is for a 1.0 volt breakdown at 100 microamperes. This means that the germanium slice to be outdiffused is heated for a shorter time to effect the required outdiffusion. Subsequently, the resulting base width of the device is shorter, thereby increasing the high frequency current gain over that attainable for a higher emitter-to-base breakdown voltage. By way of comparison a germanium transistor whose base is readjusted by the method of the present invention, can be fabricated with a resulting emitter-to-base breakdown voltage of 1.0 volt at 100 microamperes with a current gain of 6 db at 100 megacycles. By compromising the parameters, a unit can be fabricated with a resulting emitter-to-base breakdown voltage of 0.5 volt at 100 microamperes and a current gain of 10 db at 100 megacycles. A typical base impurity concentration profile, the base region being readjusted by the method of the present invention, is shown in FIGURE 1 and represented by numeral 3. As will be noticed, the surface concentration of the curve represented by numeral 3 is less than that of the curve represented by numeral 2. Further, the base width of curve 3 is shorter than that of curve 2. The best devices fabricated by methods of the prior art result in an emitter-to-base breakdown voltage of 0.4 volt at 100 microamperes with a current gain of 6 db at 100 megacycles. It will be recognized that the additional breakdown voltage and current gain of germanium transistors whose base regions are fabricated by the method set forth in the preceding description provide substantial improvements over the devices of the prior art.

Although the present invention has been described by way of example, that example specifically being a germanium transistor device, the method of the invention is equally applicable to other semiconductor materials as well. For example silicon transistors can be fabricated by utilizing as a part of the fabrication method the method of the present invention. Temperatures of from about 900° C. to about 1200° C. are used when applying this method to the outdiffusion of impurities from silicon. Reference to a table of diffusion coefficients of various impurities in silicon at various temperatures indicates the appropriate times for outdiffusion of the impurities from a heated silicon slice.

The invention is further applicable to semiconductors of any type, or for that matter, is applicable to any material wherein it is possible to diffuse impurity into and outdiffuse impurities from that material. The novel feature in the method of the present invention is seen to be a substantial reduction in impurity surface concentrations in an impurity diffused material without substantially increasing the depth of the diffused impurities.

Although preferred embodiments have been described in detail to explain the present invention, these embodiments are examples only. The present invention is susceptable to modifications, substitutions and variance without departing from the scope thereof; the invention being limited only by the appended claims.

What is claimed is:

1. A method for reducing the impurity surface concentration of a semiconductor comprising the steps of placing the semiconductor in a chamber, evacuating said chamber with a vacuum system, sealing said evacuated chamber from said vacuum system, heating said semiconductor in said chamber to a temperature sufficient to outdiffuse impurities contained therein, evacuating said chamber a second time, sealing said evacuation chamber from said vacuum system a second time, and thereafter lowering the temperature of said semiconductor sufficient to stop further outdiffusion.

2. The method as defined in claim 1 wherein a gettering agent is placed within said chamber and said gettering agent is heated to a temperature lower than that to which said semiconductor is heated.

3. A method for reducing the impurity surface concentration of a semiconductor comprising the steps of placing the semiconductor in a chamber, said chamber having an opening, placing an ultra-pure semiconductor in said chamber between said semiconductor and said opening, evacuating said chamber with a vacuum system, sealing said evacuated chamber from said vacuum system, heating said semiconductor and said ultra-pure semiconductor to a temperature sufficient to outdiffuse the impurities contained in said semiconductor, evacuating said chamber a second time, sealing said evacuation chamber from said vacuum system a second time, and thereafter lowering the temperature of said semiconductor and said ultra-pure semiconductor sufficient to stop further outdiffusion.

4. A method for reducing the impurity surface concentration of germanium comprising the steps of placing the germanium in a chamber, said chamber having an opening, placing ultra-pure germanium in said chamber between said germanium and said opening, evacuating said chamber with a vacuum system, sealing said evacuated chamber from said vacuum system, heating said germanium to a first temperature and heating said ultra-pure germanium to a lesser temperature than said first temperature, said first temperature being sufficient for outdiffusion of the impurities in said germanium, evacuating said chamber a second time, sealing said evacuation chamber from said vacuum system a second time, and thereafter lowering the temperatures of said germanium and said ultra-pure germanium to stop further outdiffusion.

5. A method for reducing the impurity surface concentration of p-type conductivity germanium comprising the steps of placing the p-type conductivity germanium in a chamber, said chamber having an opening, placing ultra-pure germanium in said chamber between said p-type conductivity germanium and said opening, evacuating said chamber with a vacuum system, sealing said evacuated chamber from said vacuum system, heating said p-type conductivity germanium to a first temperature and heating said ultra-pure germanium to a lesser temperature than said first temperature, said first temperature being sufficient for outdiffusion of the impurities in said p-type conductivity germanium, evacuating said chamber a second time, sealing said evacuation chamber from said vacuum system a second time, and thereafter lowering the temperatures of said p-type conductivity germanium and said ultra-pure germanium to stop further outdiffusion.

6. A method for reducing the impurity surface concentration of p-type conductivity germanium comprising the steps of placing the p-type conductivity germanium in a chamber, said chamber having an opening, placing ultra-pure germanium in said chamber between said p-type conductivity germanium and said opening, evacuating said chamber with a vacuum system to a pressure less than $10^{-3}$ millimeters of mercury, sealing said evacuated chamber from said vacuum system, heating said p-type conductivity germanium to a first temperature and heating said ultra-pure germanium to a temperature of from about 250 centigrade degrees to about 350 centigrade degrees below said first temperature, evacuating said chamber again so the resulting pressure is below $10^{-3}$ millimeters of mercury, sealing said evacuation chamber from said vacuum system a second time, and thereafter lowering the temperature of said p-type conductivity germanium and said ultra-pure germanium to stop further outdiffusion.

7. A method for reducing the impurity surface concentration of p-type conductivity germanium comprising the steps of placing the p-type conductivity germanium in a chamber, said chamber having an opening, placing ultra-pure germanium in said chamber between said p-type conductivity germanium and said opening, evacuating said chamber with a vacuum system to a pressure less than $10^{-3}$ millimeters of mercury, sealing said evacuated chamber from said vacuum system, heating said p-type conductivity germanium to about 700 degrees centigrade and heating said ultra-pure germanium to a temperature of from about 450° C. to about 550° C., evacuating said chamber again so the resulting pressure is below $10^{-3}$ millimeters of mercury, sealing said evacuation chamber from said vacuum system a second time and thereafter lowering the temperatures of said p-type conductivity germanium and said ultra-pure germanium to stop further outdiffusion.

8. A method for reducing the antimony surface concentration of a p-type conductivity germanium comprising the steps of placing the p-type conductivity germanium in a chamber, said chamber having an opening, placing ultra-pure germanium in said chamber between said p-type conductivity germanium and said opening, evacuating said chamber with a vacuum system, sealing said evacuated chamber from said vacuum system, heating said p-type conductivity germanium to a first temperature and heating said ultra-pure germanium to a lesser temperature than said first temperature, said first temperature being sufficient for outdiffusion of the antimony in said p-type conductivity germanium, evacuating said chamber a second time, sealing said evacuation chamber from said vacuum system a second time, and lowering the temperatures of said p-type conductivity germanium and said ultra-pure germanium to stop further outdiffusion.

9. A method for reducing the antimony surface concentration of p-type conductivity germanium that has antimony diffused therein comprising the steps of placing the p-type germanium in a chamber, said chamber having an opening, placing ultra-pure germanium in said chamber between said p-type germanium and said opening, evacuating said chamber with a vacuum system to a pressure below $10^{-3}$ millimeters of mercury, sealing said evacuated chamber from said vacuum system, heating said p-type germanium to a temperature of about 700° C. and heating said ultra-pure germanium to a temperature of from about 450° C. to about 550° C., maintaining said p-type germanium and said ultra-pure germanium at said respective temperatures for about 10 minutes, evacuating said chamber again so the resulting pressure is below $10^{-3}$ millimeters of mercury, sealing said evacuation chamber from said vacuum system a second time, and lowering the temperatures of said p-type germanium and said ultra-pure germanium to stop further outdiffusion.

References Cited by the Examiner

UNITED STATES PATENTS

| | | | |
|---|---|---|---|
| 2,834,697 | 5/58 | Smits | 148—1.5 |
| 2,870,049 | 1/59 | Mueller et al. | 148—1.5 |
| 2,928,761 | 3/60 | Gremmelmaier et al. | 148—1.5 |
| 2,950,220 | 8/60 | Genser | 148—1.5 |

OTHER REFERENCES

Bunshah: "Vacuum Metallurgy," Reinhold Publishing Corp., New York, 1959, page 302.

BENJAMIN HENKIN, *Primary Examiner.*

MARCUS U. LYONS, DAVID L. RECK, *Examiners.*